United States Patent
Hodge et al.

(10) Patent No.: US 6,939,015 B2
(45) Date of Patent: Sep. 6, 2005

(54) CHROMIUM BLACK LIGHT SHIELD

(75) Inventors: Daniel C. Hodge, Shortsville, NY (US);
Loretta R. Fendrock, Hilton, NY (US);
Dale E. Ewbank, Springwater, NY (US)

(73) Assignee: Eastman Kodak Company, Rochester, NY (US)

(*) Notice: Subject to any disclaimer, the term of this patent is extended or adjusted under 35 U.S.C. 154(b) by 0 days.

(21) Appl. No.: 10/251,145

(22) Filed: Sep. 20, 2002

(65) Prior Publication Data

US 2004/0057117 A1 Mar. 25, 2004

(51) Int. Cl.[7] ............................................. G02B 27/00
(52) U.S. Cl. .................... 359/614; 359/613; 359/601
(58) Field of Search .............................. 359/614, 601, 359/605, 613

(56) References Cited

U.S. PATENT DOCUMENTS

| | | | | |
|---|---|---|---|---|
| 5,666,177 A | * | 9/1997 | Hsieh et al. | 349/111 |
| 5,782,665 A | * | 7/1998 | Weisfield et al. | 445/24 |
| 6,266,117 B1 | * | 7/2001 | Yanagawa et al. | 349/141 |
| 2003/0102797 A1 | * | 6/2003 | Kajiwara | 313/486 |

* cited by examiner

*Primary Examiner*—Drew A. Dunn
*Assistant Examiner*—Joshua L. Pritchett
(74) *Attorney, Agent, or Firm*—Peyton C. Watkins

(57) ABSTRACT

A black light shield for preventing incident light from being received by light receiving elements, the black shield includes a support structure; a first $CrO_x$ layer disposed over the support structure for absorbing the incident light in a substantially reflected transmission path; and a second $CrO_x$ layer disposed integral with the support structure for absorbing the incident light in a substantially non-reflected transmission path.

14 Claims, 1 Drawing Sheet

CHROMIUM BLACK LIGHT SHIELD

FIELD OF THE INVENTION

The invention relates generally to the field of black light shields for image sensors, more particularly, to such black light shield that absorbs light from a plurality of transmission paths for absorbing undesirable stray light.

BACKGROUND OF THE INVENTION

Solid state image sensors are made of a grid of many smaller sensor elements. Each of these sensor elements is commonly referred to in the art as a "pixel." In operation, light shone on the active pixels generates an electrical charge that is translated into a digital image. Since image sensors are used for color imaging, in many cases, a color filter array (CFA) is placed over the image sensor. However, in order to separate the light into color bands or components, color separation inputs are required. Depending on the configuration of the image sensor, some times these CFA are spaced apart from each other. When doing this spacing, it is desirable to use some type of light blocking or light absorbing material. This color separation is achieved in many ways in the prior art.

One such way is to have chromium oxide and chromium metal disposed on a substrate. Although satisfactory, this arrangement includes drawbacks. One such drawback is that light intended for one color channel may be reflected or directed to another color channel. For example, and referring to FIG. 1, a portion of the light (not shown) passes to its intended pixel 20. Another portion of the light is absorbed by the chromium oxide 15 as shown, and an undesirable stray portion of the light passes through a first color filter 10 at an angle such that it is not absorbed by its intended pixel 20, but instead passes to the substrate 23 of the color light sensing device 25 that is beneath the black light shield 35. This light is then reflected by the chromium metal surface of the black light shield 35 to an adjacent color channel 30. This is obviously undesirable.

Consequently, a need exists for a black light shield that prevents light from one color channel from being reflected or directed to another color channel.

SUMMARY OF THE INVENTION

The present invention is directed to overcoming one or more of the problems set forth above. Briefly summarized, according to one aspect of the present invention, the invention resides in a black light shield for preventing incident light from being received by light receiving elements, the black light shield includes (a) a support structure; (b) a first $CrO_x$ layer disposed over the support structure for absorbing the incident light in a substantially reflected transmission path; and (c) a second $CrO_x$ layer disposed integral with the support structure for absorbing the incident light in a substantially non-reflected transmission path.

These and other aspects, objects, features and advantages of the present invention will be more clearly understood and appreciated from a review of the following detailed description of the preferred embodiments and appended claims, and by reference to the accompanying drawings.
Advantageous Effect of the Invention The present invention has the following advantages of a black light shield that is constructed of a three or more layer stack incorporating chromium oxide and chromium metal. The advantage of this configuration is that reflectivity from both sides of the black light shield is made very low while simultaneously controlling transmission through the black light shield, and additionally, stress can be controlled.

Since the black light shield is made of similar materials, chromium metal and chromium oxide, the black light shield tailors itself very well to processes widely used in the semiconductor industry such as photolithography and wet etching. Thus, this makes the black light shield very easily patterned for use in many designs with commercially available chemistry.

Still further, the black shield may be easily re-patterned in a different manner through the use of wet or dry etch.

DETAILED DESCRIPTION OF THE INVENTION

Figure 1:
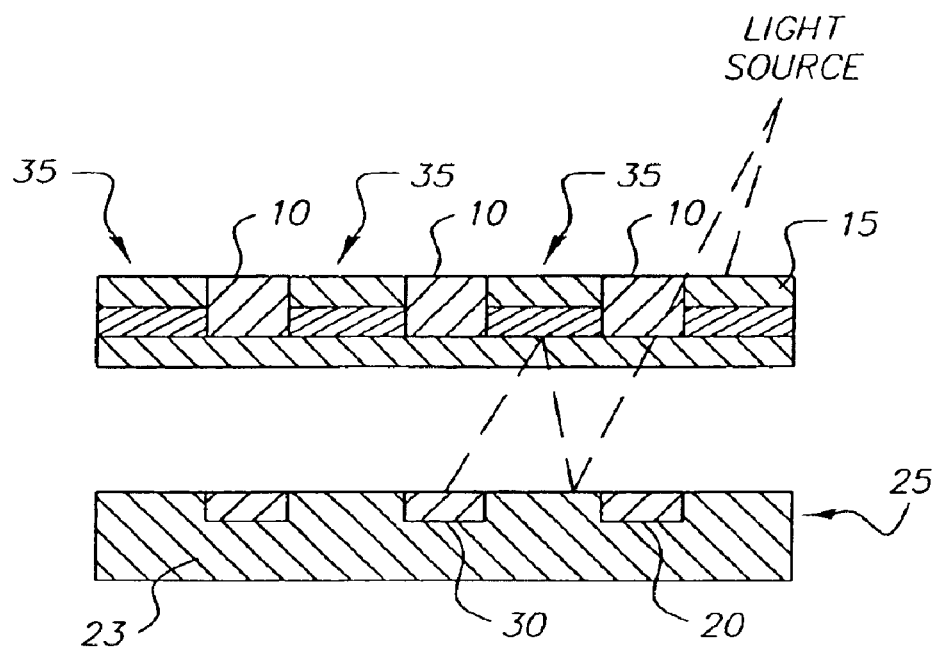
FIG. 1 is a cutaway view of a prior art image sensor.
Figure 2:
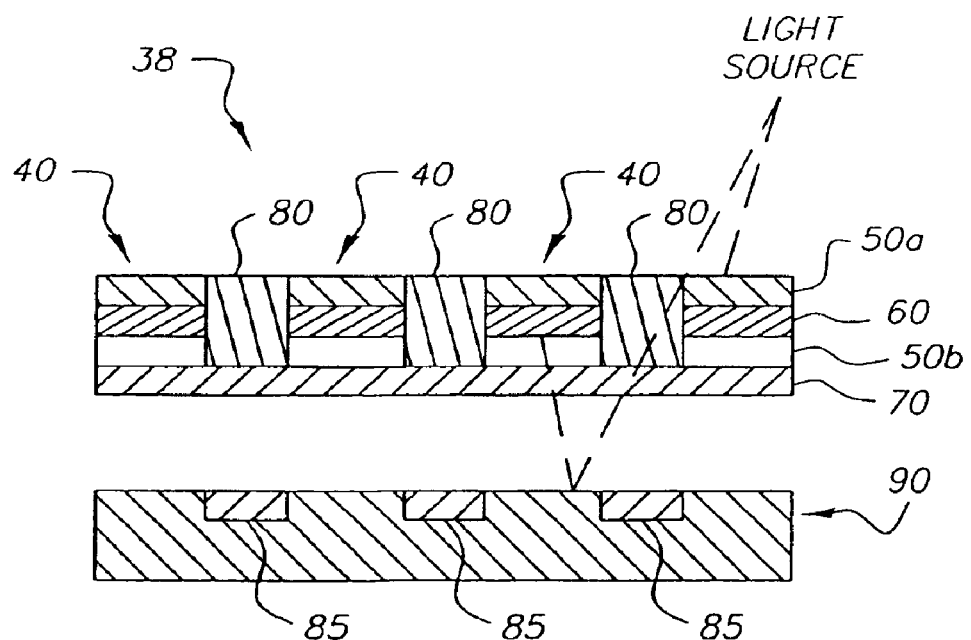
FIG. 2 is a cutaway view of the image sensor of the present invention.

Referring to FIG. 2, an image sensor 38 of the present invention is shown. The image sensor includes a plurality of black light shields 40 patterned with a plurality of color filters 80 in a predetermined configuration, alternating strips in the preferred embodiment. Although the preferred embodiment illustrates alternating strips, those skilled in the art will readily recognize that there are a variety of alternative configurations. It is instructive to note that most of the incoming light (not illustrated) will pass through the color filters 80 and onto its intended pixel 85. Some light will not pass to its intended pixel 85, and this stray light is shown in FIG. 1 for illustrating the advantageous effect of the present invention. In this regard, the present invention includes three layers of both chromium oxide 50 and chromium metal 60 that are fabricated on a suitable support structure or substrate, such as quartz, glass or silicon 70. More particularly, the black light shield 40 includes two layers of chromium oxide 50 respectively layered over a side of the chromium metal 60. As discussed hereinabove, color filters 80 are positioned between the black light shields 40 for permitting light to pass to their respective pixels. It is instructive to note that the chromium oxide layers 50 are both non-reflective and non-transmissive. The reasons for making the black light shield non-reflective from both sides and non-transmissive are as follows. When placed over the light sensing device 90, light can enter at oblique angles and reflect off either the packaging (not shown) or the light sensing device imager 90. This stray reflection from the light sensing device 90 is absorbed by the chromium oxide layer 50b and not reflected back into the active pixel area 85 of the sensor 38. It is instructive to also note that a portion of the light is directly absorbed by the chromium oxide layer 50a.

Both sides of the black light shield are made to have very low reflectance, well under 5%, which allows for very little interference from stray light. This is done by making an interference layer out of the chromium oxide layers 50a and 50b. By controlling various parameters during deposition, the thickness and percent reflectivity are controlled.

By depositing the chromium metal layer 60 in between the chromium oxide layers 50 you can control the amount of light that transmits through the black light shield 40. This layer 60 is also the layer that has a great influence on the overall stress of the black light shield. By increasing or decreasing the amount of chromium metal 60 deposited the black light shield 40 is made more compressive or tensile.

The chromium oxide layers have a smaller range of thickness compared to the chromium metal layer; for example, between 500 to 1000 angstroms of thickness. This can be varied to optimize the desired reflectivity of the black light shield 40 dependent on the material the $CrO_x$ interfaces with. The chromium metal layer 60 only has to be thick enough to block the transmission of light, but as mentioned above, this layer also serves as a stress controlling layer and can be made several microns thick if needed.

The invention has been described with reference to a preferred embodiment. However, it will be appreciated that variations and modifications can be effected by a person of ordinary skill in the art without departing from the scope of the invention.

| PARTS LIST | |
|---|---|
| 10 | color filters |
| 15 | chromium oxide |
| 20 | pixel |
| 23 | substrate |
| 25 | color light sensing device |
| 30 | adjacent color channel |
| 35 | black light shield |
| 38 | image sensor |
| 40 | black light shields |
| 50 | chromium oxide layers |
| 50a | chromium oxide layer |
| 50b | chromium oxide layer |
| 60 | chromium metal |
| 70 | substrate |
| 80 | color filters |
| 85 | pixels |
| 90 | light sensing device |

What is claimed is:

1. A black light shield for preventing incident light from being received by a plurality of pixels of an image sensor, the black shield comprising:
   (a) a support structure;
   (b) a first $CrO_x$ layer disposed spanning the support structure for absorbing the incident light in a substantially reflected transmission path; and
   (c) a second $CrO_x$ layer disposed spanning the support structure for absorbing the incident light in a substantially non-reflected transmission path; wherein the plurality of pixels of the image sensor span at least a portion of the substrate in a predetermined pattern and receive the incident light.

2. The black light shield as in claim 1 further comprising:
   (e) chromium metal disposed between the first $CrO_x$ and the second $CrO_x$ for blocking residual light transmitted through either the first or second $CrO_x$.

3. The black light shield as in claim 1, wherein the support structure is either quartz, glass or silicon substrate.

4. The black light shield as in claim 1, wherein the first $CrO_x$ is chromium oxide.

5. The black light shield as in claim 4, wherein the second $CrO_x$ is chromium oxide.

6. The black light shield as in claim 5, wherein the first and second chromium oxide each having a thickness of substantially between 500 to 1000 angstroms.

7. The black light shield as in claim 1 further comprising (d) a plurality of color filters disposed in both the first and second $CrO_x$ layer for permitting a portion of the incident light to be received by the pixels.

8. A method for preventing incident light from being received by a plurality of pixels of an image sensor, the method comprising the steps of:
   (a) providing a support structure;
   (b) providing a first $CrO_x$ layer disposed spanning the support structure for absorbing the incident light in a substantially reflected transmission path; and
   (c) providing a second $CrO_x$ layer disposed spanning the support structure for absorbing the incident light in a substantially non-reflected transmission path; wherein the plurality of pixels of the image sensor span at least a portion of the substrate in a predetermined pattern and receive the incident light.

9. The method as in claim 8 further comprising the step of (e) providing chromium metal disposed between the first $CrO_x$ and the second $CrO_x$ for blocking residual light transmitted through either the first or second $CrO_x$.

10. The method as in claim 8 further comprising the step of providing the support structure as either quartz, glass or silicon substrate.

11. The method as in claim 8 further comprising the step of providing the first $CrO_x$ as chromium oxide.

12. The method as in claim 11 further comprising the step of providing the second $CrO_x$ as chromium oxide.

13. The method as in claim 12 further comprising the step of providing the first and second chromium oxide each having a thickness of substantially between 500 to 1000 angstroms.

14. The method as in claim 8 further comprising (d) providing a plurality of color filters disposed in both the first and second $CrO_x$ layer for permitting a portion of the incident light to be received by the pixels.

* * * * *